United States Patent [19]

DiSanto et al.

[11] Patent Number: 4,892,607

[45] Date of Patent: Jan. 9, 1990

[54] CHIP MOUNTING TECHNIQUES FOR DISPLAY APPARATUS

[75] Inventors: Frank J. DiSanto, North Hills; Denis A. Krusos, Lloyd Harbor, both of N.Y.

[73] Assignee: Copytele, Inc., Huntington Station, N.Y.

[21] Appl. No.: 208,854

[22] Filed: Jun. 14, 1988

Related U.S. Application Data

[63] Continuation of Ser. No. 938,147, Dec. 4, 1986, abandoned.

[51] Int. Cl.[4] ............................................. B32B 31/28
[52] U.S. Cl. ................................... 156/275.7; 156/297; 357/73; 357/74; 445/24
[58] Field of Search .................... 357/30, 67, 72, 74, 357/80; 250/492.1, 492.2, 372, 493.1, 504 R; 350/332, 333, 96.11, 96.12; 445/24; 340/718, 719; 437/51, 180, 209, 248; 156/272.2, 275.5, 275.7, 297, 299, 308.2

[56] References Cited

U.S. PATENT DOCUMENTS

| | | | |
|---|---|---|---|
| 1,946,878 | 2/1934 | Pazziani | 156/299 |
| 3,989,778 | 11/1976 | Osborne | 156/308.2 |
| 4,222,635 | 9/1980 | Jolke | 156/275.5 |
| 4,418,284 | 11/1983 | Ogawa | 156/275.7 |
| 4,661,191 | 4/1987 | Kamio | 156/275.7 |

Primary Examiner—Merrell C. Cashion, Jr.
Attorney, Agent, or Firm—Arthur L. Plevy

[57] ABSTRACT

Driver circuit chip mounting techniques for use in the fabrication of monolithic flat panel displays are disclosed in accordance with the teachings of the present invention. According to a preferred embodiment, a driver circuit having a spot of optical cement is precisely positioned within a location of metalized, grouped and patterned row or column conductors. Thereafter collimated ultraviolet light is imaged through the display onto the rear of the driver circuit until the optical cement has become sufficiently tacky to permit the display to be inverted whereupon collimated ultraviolet light may be directly applied to complete the full curing of the optical cements.

5 Claims, 3 Drawing Sheets

CHIP MOUNTING TECHNIQUES FOR DISPLAY APPARATUS

This is a continuation, of application Ser. No. 938,147, filed Dec. 4, 1986 now abandoned.

BACKGROUND OF THE INVENTION

This present invention relates to chip mounting techniques for display apparatus and more particularly to improved techniques for mounting driver chips and the like to monolithic flat panel display apparatus and the monolithic flat panel display apparatus resulting therefrom.

Recent advances in the construction of monolithic flat panel display apparatus, as disclosed for example in U.S. application Ser. No. 905,570, now U.S. Pat. No. 4,772,820, entitled Monolithic Flat Panel Display Apparatus and Methods for Fabrication Thereof, filed on Sept. 11, 1986 in the names of Frank J. DiSanto, Sr. and Denis A. Krusos, and assigned to the assignee hereof, have resulted in a simplification in the fabrication and structure of monolithic flat panel display apparatus such as electrophoretic display panels. Thus, according to the teachings of that patent application, methods for fabricating monolithic flat panel displays are disclosed, together with the resulting display, wherein the end portions of the row and column conductors of the display panel are metalized, grouped and patterned to accept a driver circuit within the pattern of each group. The driver circuit is then bonded to the panel and each input to and output from the driver circuit to be employed is wire bonded to the patterned conductor portions within the group associated therewith.

This provides an integral one piece panel structure and wholly avoids a need for the separate carrier board structure previously utilized. This carrier board structure is described, for instance, in U.S. Pat. No. 4,598,960, entitled "Methods and Apparatus for Connecting Closely Spaced Large Conductor Arrays Employing Multiconductor Carrier Boards" which issued on July 8, 1986 to Frank J. DiSanto, Sr. and Denis A. Krusos and is commonly assigned. These carrier boards were utilized to provide a mounting configuration for each of the large number of driver circuits relied upon in an electrophoretic display panel and more particularly to provide coupling between the outputs of these driver circuits and the large number of row and column conductors within an electrophoretic display panel. Additionally, connections to the inputs for each of the drive circuits were also provided by the carrier boards.

Avoiding the need for carrier boards represented a marked improvement in the resulting structure of the electrophoretic display panel since a mechanical sandwiching of carrier boards having driver circuits about the periphery of the display panel was no longer required. Further, marked improvements in reliability resulted because the mechanical interconnection of the inputs and outputs of the driver circuits were replaced with highly reliable and relatively easily implemented wire bonding techniques. Thus, fabrication costs and complexity were markedly reduced while the reliability of the resulting display was enhanced.

In U.S. Pat. No. 4,655,897 (Ser. No. 670,571) entitled "Electrophoretic Display Panels and Associated Methods" as filed on Nov. 13, 1984; U.S. application Ser. No. 799,458, now U.S. Pat. No. 4,742,345, entitled "Electrophoretic Display Panel Apparatus and Methods Therefor" as filed on Nov. 19, 1985; and in U.S. Pat. No. 4,772,820, entitled "Monolithic Flat Panel Display Apparatus and Methods for Fabrication Thereof", as aforesaid, electrophoretic displays having an 8½ by 11 display area exhibiting a resolution of 200 lines per inch are disclosed. In such displays, 2200 horizontally disposed row or cathode conductors and 1700 vertically disposed column or grid conductors are utilized to achieve the requisite 200 line per inch resolution. When the display is configured in the manner described in U.S. Pat. No. 4,772,820 entitled "Monolithic Flat Panel Display Apparatus and Methods for Fabrication Thereof", each group of 64 row and column conductors are metalized, and patterned, to accept a driver circuit within the pattern of each group.

The driver circuit is then bonded to the panel and each output to the driver circuit is wire bonded to the patterned conductor portions within the group associated therewith. Inputs peripherally disposed at the edge of the electrophoretic panel are also wire bonded to the individual driver circuits. Hence, under these conditions 35 individual driver circuits are employed for the 2200 row or cathode conductors while 27 driver chips are utilized for the 1700 vertically disposed column or grid conductors wherein the row driver chips are disposed in a column direction and conversely the column driver chips are disposed in a row direction. In this regard it may also be noted that while an exemplary resolution of 200 lines per inch has been discussed, substantially greater resolution is available at this time.

Once the entire conductor structure for the monolithic flat panel display apparatus described in U.S. Pat. No. 4,772,820, as aforesaid, has been formed, the conductors described are grouped, patterned and metalized such that each group of 64 conductors have their individual conductors disposed about and contiguous to 3 sides of a rectangular area where the conductor portions proximate thereto are metalized so that connection through wire bonding techniques may be employed. In addition, the remaining side of the rectangular open area within each pattern formed is proximate to the peripherally disposed input conductors provided for each group of row and column drivers.

At this juncture, a conventional chip mounting machine is employed to precisely dispose each driver chip within the rectangular area provided within each pattern and a small spot of low temperature thermal setting epoxy or similar adhesive is placed on the bottom of each chip so that the same may be mounted by the chip mounting machine within the rectangular area provided. Once all of the row and column driver chips are properly positioned in their requisite locations, the entire panel is placed in an oven set at a temperature of approximately 120° C. for approximately two hours to allow the epoxy bond formed intermediate the bottom surface of the row or column driver chips and the glass display panel to cure. After this has been completed, actual connection of each of the 64 row or column conductor in a group is made to each of the 64 outputs of the row or column driver chip and each of 10 inputs at the rear of the chip is connected to associated input-/output drive lines on the display. This is done through the use of a conventional wire bonding machine.

Once the panel is thus formed, the anode structure, which may take the form of a sheet of glass having a thin conductive layer of indium tin oxide (ITO) disposed thereon, is sealed over appropriate portions of the display panel being formed so that the entire display area of the completed panel is sealed. Thereafter, electrophoretic dispersion materials which basically take the form of pigment particles dispersed within a suitable solvent, as disclosed for instance in U.S. Pat. No. 4,655,897 and/or U.S. Pat. No. 4,742,345, as aforesaid, are disposed within the space between the anode and grid/cathode structure. The fill holes are then sealed to complete the panel assembly.

Once completed, the electrophoretic display panel formed may be mounted within a suitable housing, tested for reliability and then mounted within an appropriate product. As a large number of driver circuits are employed for driving the 3900 row and column conductors present, it is not infrequent that in testing an assembled panel it is noted that selected row or column conductors are not appropriately energized. Defects of this type are almost always attributable to a defective driver circuit. This occurs despite preliminary testing of the driver circuit prior to its mounting in the monolithic flat panel display being formed.

The integrated driver circuits are the most expensive components on the panel, correction of the defect, rather than a discarding of the panel formed, is the desired remedy. However, while it is relatively easy to locate the defective IC driver since it is directly associated with a group wherein one or more row or column conductors will not energize, replacement of the defective drive circuit within an already assembled array represents a difficult task.

More particularly, it will be recalled that in the fabrication techniques discussed, each driver circuit was provided with a spot of low temperature thermal setting epoxy or similar adhesive and placed directly on the glass panel at the selected and patterned location associated with the group of conductors which were to be driven. Once all of the driver chips were appropriately placed on the panel being formed, the panel was placed in an oven set at a temperature of approximately 120° C. for approximately 2 hours to allow the epoxy bond formed intermediate the bottom surface of the driver chip and the display panel to cure. Once this was completed, connection of each of the inputs and outputs thereof to appropriate conductors within the array was implemented through the use of a conventional wire bonding machine. This is not only a time consuming procedure but in addition, once the entire display has been finished by the addition of electrophoretic material and the sealing of an anode thereto, the step of placing the same within an oven to be baked is generally unavailable. This occurs since the solvents employed for the electrophoretic material will tend to vaporize during baking causing the assembled panel to leak, crack or in other ways become defective. Thus, while it is relatively easy to sever the wire bond connections to a particular chip and thereafter fracture or break the bond formed by the single spot of epoxy or other adhesive employed, mounting a new driver chip becomes quite difficult as thermal curing of the same is unavailable due to the presence of the solvents utilized in the electrophoretic dispersion now present within the display panel formed.

Therefore, it is a principal object of the present invention to provide improved techniques for mounting driver chips in flat panel display apparatus.

A further object of this invention is to provide electrophoretic display apparatus and methods for the fabrication of the same wherein row and column driver circuits are bonded to the display panel through optical techniques.

An additional object of the present invention is to provide driver circuit mounting techniques for display apparatus wherein the bonding techniques employed may be utilized once a completed display has been formed.

Various other objects and advantages of the present invention shall become clear from the following detailed description of an exemplary embodiment thereof and the novel features will be particularly pointed out in conjunction with the claims appended hereto.

SUMMARY OF THE INVENTION

In accordance with the teachings of the present invention, driver circuit chip mounting techniques for use in the fabrication of monolithic flat panel displays are disclosed, together with the resulting display apparatus, wherein a driver circuit having a spot of optical cement is precisely positioned within a location of metalized, grouped and patterned row or column conductors and thereafter collimated ultraviolet light is imaged through the display onto the rear of the driver circuit until the optical cement has become sufficiently tacky to permit the display to be inverted whereupon collimated ultraviolet light may be directly applied to complete the full curing of the optical cement.

BRIEF DESCRIPTION OF THE DRAWINGS

The invention will be more clearly understood by reference to the following detailed description of an exemplary embodiment thereof in conjunction with the accompanying drawings in which.

DETAILED DESCRIPTION

From what has been stated above, it will be appreciated that a typical 8½ by 11 inch electrophoretic display exhibiting a resolution of 200 lines per inch will include some 2200 cathode or row conductors and some 1700 column or grid conductors, together with an overlying anode structure. In an effort to present an overall appreciation of the structure and environment associated with the present invention, only the upper left hand corner of such a display has been illustrated in FIG. 1, the left hand corner illustrated comprising approximately 192 row or cathode conductors and 256 column or grid conductors. Thus, the same may be treated as a complete display of reduced size or a portion of the larger display, it being understood that all that is required to extend what is illustrated in FIG. 1 to a full size 8½ by 11 display is an extension of what is shown in the row and column directions.

Figure 1:
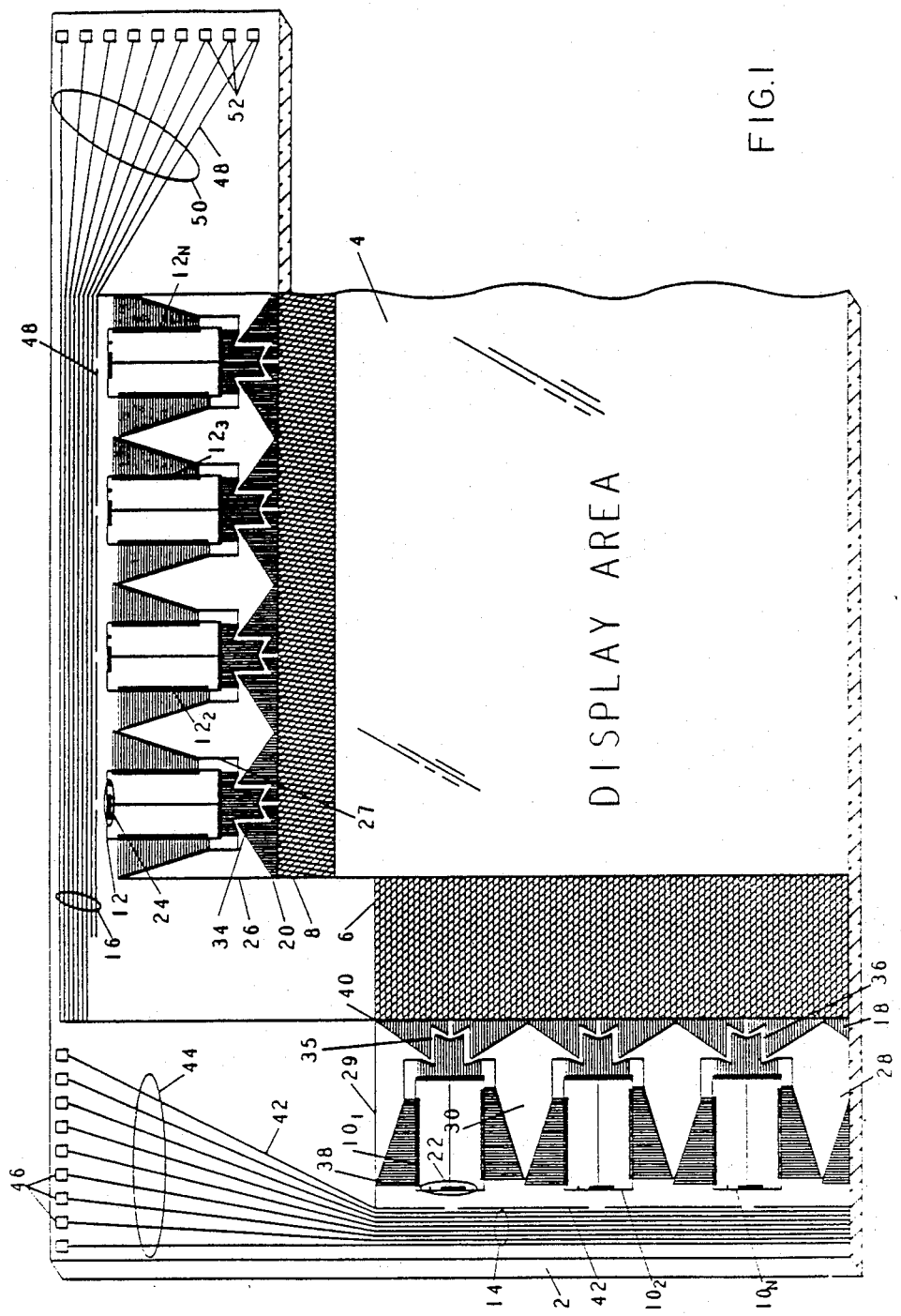
FIG. 1 is a pictorial view illustrating a portion of monolithic flat panel display apparatus having row and column driver circuits mounted therein in accordance with the teachings of the instant invention.

The portion of the monolithic flat panel display illustrated in FIG. 1 comprises a glass panel or base plate 2 which, as described in greater detail in U.S. Pat. No. 4,772,820, whose disclosure is hereby incorporated by reference herein, is preferably coated with a thin layer of indium-tin-oxide (ITO) as available as described in U.S. Pat. No. 4,655,897 from many suppliers. While glass overcoated with a thin ITO layer is preferred, other materials which are commonly employed in electrophoretic displays or the like may also be employed for the base coating. The ITO layer is etched and portions thereof are metalized to form row conductors and the row drive lines depicted in FIG. 1. After applying an insulating layer covered with a metalized layer suitable etching techniques are used to form the column conductors and the associated column drive lines. The coating of ITO on glass plate 2 is transparent while yielding a conductor structure which may be readily etched. The anode structure for the display illustrated in FIG. 1 is not shown.

The portion of the monolithic flat panel display shown in FIG. 1 comprises a display area 4, row conductors 6, column conductors 8, row driver circuits $10_l$–$10_n$, column driver circuits $12_l$–$12_n$ and input drive lines 14 and 16 for the row and column driver circuits. The display area 4 is shown clear to assist in the depicture thereof, it being appreciated that the same has a row and column conductor density of 200 lines per inch. The rows 6 and column conductors 8 are illustrated in FIG. 1 between the boundary lines 18 and 20 as extending to and from the display in the ungrouped manner in which the same reside within the display area in the horizontal and vertical directions. After the locations indicated by the boundary lines 18 and 20, the row and column conductors 6 and 8 are grouped and patterned to facilitate connection to the row and column driver circuits $10_l$–$10_n$ and $12_l$–$12_n$. The location of the boundary lines 18 and 20 may vary to suit manufacturing and/or design convenience. Those of ordinary skill in the art will appreciate that the display achieved within the display area 4 is a function of the potential applied to predetermined ones of the row and column conductors 6 and 8 since a potential present at the various intersections of these conductors within the display area 4 causes a propagation of electrophoretic particles suspended within a solvent within the display area 4 to achieve the display pattern. A detailed understanding of the operation of electrophoretic displays of the type being described herein may be found in U.S. Pat. Nos. 4,655,897 and 4,742,345, as aforesaid.

Each of the row and column conductors 6 and 8 within the display apparatus illustrated in FIG. 1 is metalized in the manner described in U.S. Pat. No. 4,772,820, as aforesaid, and grouped and patterned in the manner illustrated in FIGS. 2 and 4 to facilitate mounting and connection to the row and column drive circuits $10_l$–$10_n$ and $12_l$–$12_n$. The row and column driver circuits $10_l$–$10_n$ and $12_l$–$12_n$ each comprise an integrated circuit chip of the type described in U.S. Pat. No. 4,598,960 and perform the functions set forth in that patent as well as the functions described in somewhat greater detail in U.S. Pat. No. 4,742,345. Each of the integrated circuits forming the row and column driver circuits $10_l$–$10_n$ and $12_l$–$12_n$ receive 9 inputs and has one output as indicated generally to the rear of the row driver circuits $10_l$–$10_n$ and to the top of the column driver circuits $12_l$–$12_n$. In response thereto the driver circuits selectively apply potential to each of the 64 outputs thereof to energize the 64 row and column conductors 6 and 8 connected to the outputs of each of the row driver circuits $10_l$–$10_n$ and column driver circuits $12_l$–$12_n$.

Figure 2:
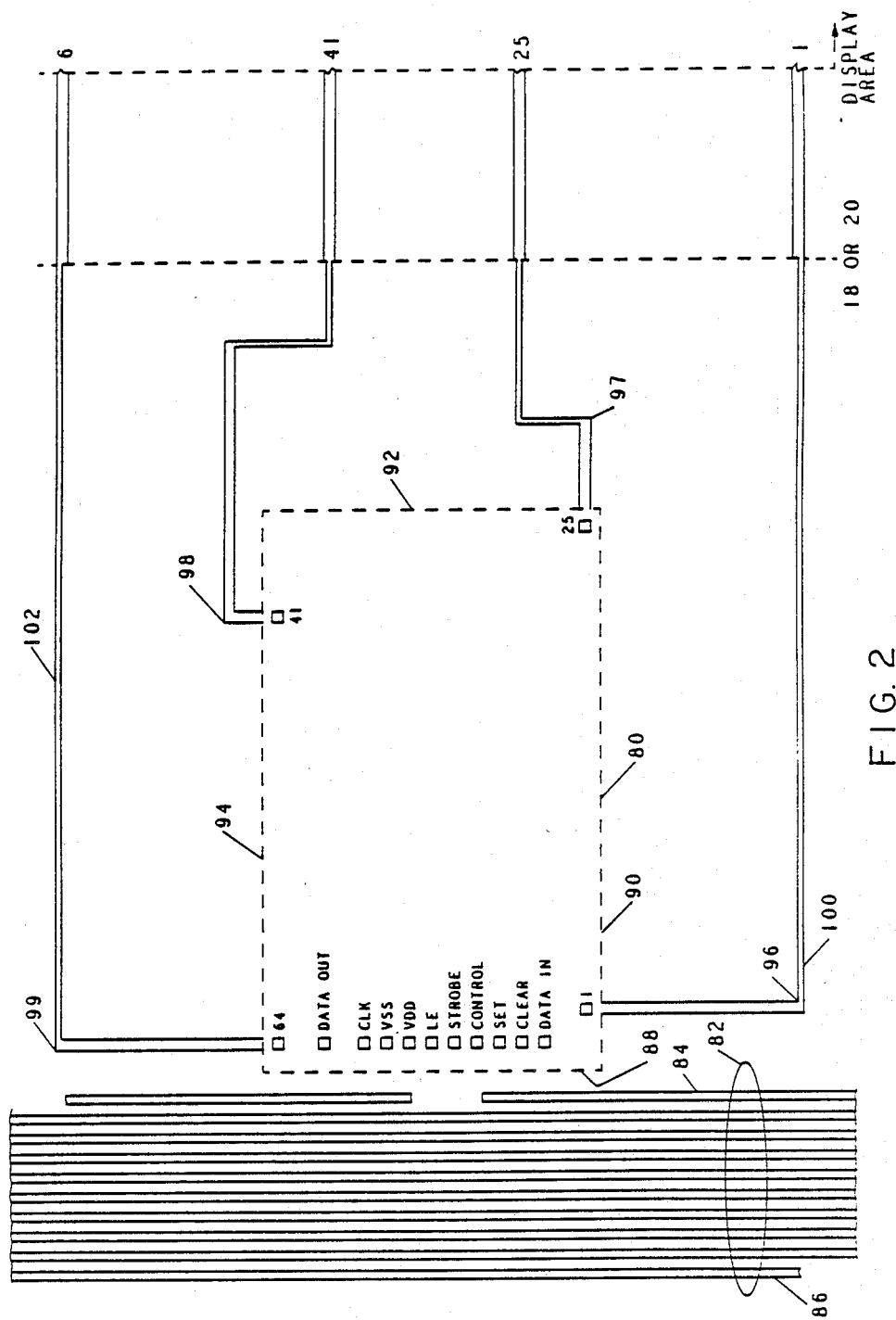
FIG. 2 is a top view illustrating the manner in which end portions of row or column conductors are grouped and patterned for purposes of accepting a driver circuit.
Figure 4:
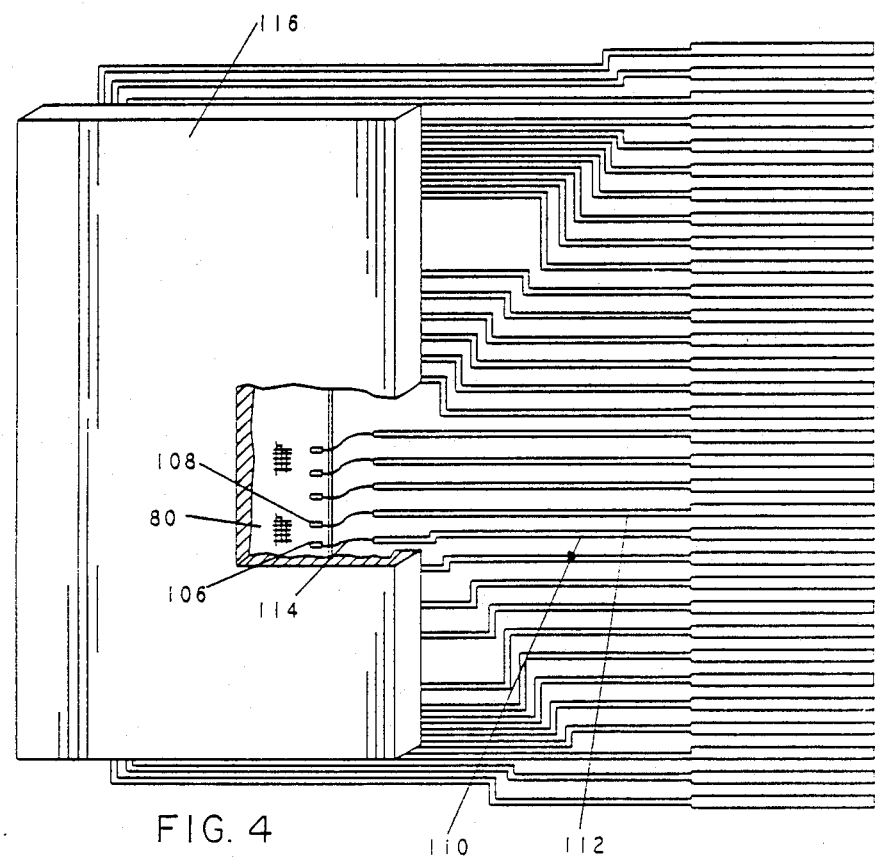
FIG. 4 is a top view illustrating the manner in which a driver circuit is mounted and connected to end portions of row or column connectors in a monolithic flat panel display according to the present invention.

The 64 outputs of each of the row and column driver circuits $10_l$–$10_n$ and $12_l$–$12_n$ are peripherally arranged about three sides of the integrated circuit employed as the driver circuit as generally indicated in FIG. 1 and more clearly shown in FIGS. 2 and 4. Actual connections to the inputs and outputs of the row and column driver circuits $10_l$–$10_n$ and $12_l$–$12_n$ has not been shown in FIG. 1 for purposes of facilitating illustration. The relationship between each of the inputs and outputs of respective row $10_l$–$10_n$ and column $12_l$–$12_n$ driver chips is readily apparent. For purposes of appreciating what is illustrated in FIG. 1, it is here sufficient to appreciate that each of the ten inputs to the row driver circuits $10_l$–$10_n$, as generally indicated as 22 in FIG. 1, are supplied from the input drive lines for the rows indicated by 14 in FIG. 1, while each of the inputs for the column drive circuits $12_l$–$12_n$, as generally indicated by 24, are connected to individual ones of the drive lines 16. Outputs of each of the row and column conductor drive circuits $10_l$–$10_n$ and $12_l$–$12_n$ are arranged about the periphery such that as better illustrated in connection with FIG. 2, 24 outputs i.e. 1–25 and 41–64 disposed at each side of the chip while the remaining 16 outputs are disposed along the side opposite to the inputs 22 and 24. Each group of 64 row conductors 6 and 64 column conductors 8 are metalized in the manner described in connection with U.S. Pat. No. 4,772,820 in order to facilitate connection to the outputs of an associated one of the row and column driver circuits $10_l$–$10_n$ and $12_l$–$12_n$ by use of a wire bonding machine. This is done as connection to a conductor formed of ITO or the like is not readily available with a wire bonding machine and the very thin nickel, which is commonly employed for the column conductors 8, presents similar difficulties.

Each group of 64 conductors is patterned in a manner best illustrated in FIG. 2 to provide a location for the integrated circuit chip serving as the row or column driver circuit $10_l$–$10_n$ and $12_l$–$12_n$ in such a manner as to dispose each of the 64 metalized conductors in the group at a location so that the same is proximate to an associated one of the 64 outputs on the rows or column driver circuits $10_l$–$10_n$ and $12_l$–$12_n$. For purposes of facilitating representation in FIG. 1, it should be noted that the arrow-like representations 26–30 and the chevron-like representations 32–36 represent groups of conductors. Thus, individual row conductors should be viewed as entering a grouping at an aslantly disposed edge thereof for entry into the generalized bundle of row and column conductors 6 and 8 shown between the display area and the boundary lines 18 and 20 and conversely leave the arrow-like representations 26–30 and the chevron-like representations 32–36 along other aslantly disposed edges thereof for application toward an individual output of the driver chips $10_l$–$10_n$ and $12_l$–$12_n$. This form of representation serves to generally provide the reader with an overall understanding of the manner in which 64 row or column conductors are associated with each of the row and driver chips $10_l$–$10_n$ and $12_l$–$12_n$ and readily facilitates an understanding of the manner in which a full electrophoretic display panel having 2200 row conductors and 1700 column conductors is organized. In the case of a full scale display, 35 row driver circuits $10_l$–$10_n$ and 27 column driver circuits $12_l$–$12_n$ arranged about the periphery of the glass panel or base plate 2 in precisely the same manner illustrated for the portion thereof shown in FIG. 1 would be employed.

Input drive lines 14 for each of the row driver circuits $10_I$–$10_n$ comprise 9 parallel conductors which are etched along the left side of the glass panel 2 in the manner illustrated to provide the 9 requisite inputs and one output for each of the row driver circuits $10_I$–$10_n$. In this regard it should be noted that an inspection of FIG. 1 will reveal that drive line 42 within the group of 9 etched input drive lines 14 is split in the vicinity of each of the row driver circuits $10_I$–$10_n$ to provide a data-in and data-out drive line for each of the row driver chips $10_I$–$10_n$ so that a serial-in/serial-out relationship is provided. Thus, the single drive line 42 within the group of 9 drive lines 14 for the row driver circuits $10_I$–$10_n$ is split so that one side of the drive line may be connected to the data-in input of a given one of the row driver circuits $10_I$–$10_n$ while the opposite side is connected to the data-out output of that chip. The same side of the driver line 42 is in turn connected to the data-in input of the adjacent driver circuit chip affecting serial connection of the data-in and data outputs of each of the row driver chips $10_I$–$10_n$ in a manner well known to those of ordinary skill in the art.

The 9 input drive lines 14 effectively supply the 10 input/output connections for each of the row driver circuits $10_I$–$10_n$. Each of the 9 drive lines 14 within the input drive line group 14 is flared out in the manner indicated at 44 and provided with a contact pad 46 to facilitate connection to external circuitry.

In precisely the same manner, the input drive lines 16 are etched as a group of 9 drive lines to provide 10 input/output connections to the column driver circuits $12_I$–$12_n$. Here, the input drive lines 16 are horizontally disposed along the periphery of the glass panel 2. The drive line 48 is again split in the vicinity of each of the column driver circuits $12_I$–$12_n$ to again facilitate the serial connection of the input of the data-in and data-out connections to each of the column driver circuits $12_I$–$12_n$. The etched column drive lines 16 are flared out in the manner indicated at 50 toward the right end of the glass panel 2 and contact pads 15 are provided to facilitate connection to external drive circuitry. The flared out portion 50 of the etched column drive line 16 preferably occurs subsequent to the location of the last row driver circuit $12_n$ and hence in a display employing 27 column driver circuits $12_I$–$12_{27}$ the flared out portion of the drive lines 16 would in fact appear at the edge of the display in a comparable manner to that illustrated at 44 for the drive lines 14.

Connection of each of the inputs and outputs to the row $10_I$–$10_n$ and column $12_I$–$12_n$ driver circuits to the row 6 and column conductors 8 as well as the input/output drive lines 14 and 16 are made by use of a wire bonding machine after the row $10_I$–$10_n$ and column $12_I$–$12_n$ driver integrated circuits are bonded to the glass panel or base plate 2 in the manner described in connection with FIG. 3. Thereafter, an anode structure not shown in FIG. 1 is mounted to the monolithic flat panel display apparatus illustrated in FIG. 1, and electrophoretic particles suspended in the solvent are disposed in the display area to form an integral, one piece display not requiring mechanical assembly other than the mounting of the same within a suitable frame structure or housing. The arrangement is highly advantageous in that all electrical connections may be implemented through the use of wire bonding machines or the like to insure rapid assembly and the reliability which attends a structure not requiring mechanical connections of electrical contacts and the attendant clamping associated therewith.

The row and column conductors are formed and metalized in the manner described in detail in U.S. Pat. No. 4,772,820. Referring now to FIG. 2, there is shown a top view illustrating the manner in which end portions of the row and column conductors are grouped and patterned for accepting a driver circuit. Thus, as shown in FIG. 2, each group of 64 row and column conductors in the monolithic flat panel display illustrated in FIG. 1 is arranged and patterned in the manner shown to accept, and subsequently be connected to, an associated row or driver circuit $10_I$–$10_n$ or $12_I$–$12_n$. In the case of an 8½ by 11 inch display having approximately 2200 row or cathode conductors and 1700 column or grid conductors, 35 groupings of row driver circuits $10_I$–$10_n$ would be present while 27 groupings for column driver circuits $12_I$–$12_n$ would be present. Each grouping formed would be identical to that shown in FIG. 2.

In FIG. 2 an exemplary row or column driver circuit has been indicated by the dashed block 80 to illustrate the outline of the driver chip per se and exemplary outputs 1, 25, 41 and 64 have been illustrated, as have the 10 I/0 connections thereto. An associated input/output drive line array 82, corresponding to an appropriate one of the input/output drive line arrays 14 and 16 illustrated in FIG. 1 has also been indicated in FIG. 2.

The I/0 drive line array 82 is etched at the peripheral portion of the array as indicated in FIG. 1 so as to provide 9 parallel conductors in the manner illustrated in FIG. 2. The closest conductor 84 to the chip location 80 is split so as to provide for the serial connection of each row or column driver to the single split line to obtain the serial connection of the data-in and data-out outputs of each chip, as aforesaid. Although any convenient spacing and arrangement may be employed for the I/0 drive line array 82, a convenient arrangement for embodiments of the instant invention is to provide an I/0 drive line array wherein each conductor has a typical width of 0.004 inch and is spaced from the adjacent conductor within the array by a distance of 0.004 inch. The initial conductor in the array, i.e. conductor 86, is typically disposed 0.1832 inch from the edge of the glass plate 2 and the distance allotted between the edge of the last conductor 84 in the array and the rear edge 88 of the row or column driver 80 is 0.010 inch. The I/0 drive line array 82 may be printed on the ITO coated glass plate 2 through use of conventional photomask techniques such as described in connection with U.S. Pat. No. 4,772,820.

The row or column driver 80 which may be conventional will have nominal dimensions of 0.2428 inch by 0.1448 inch with the shorter dimension obviously located along the edge 88 illustrated in FIG. 2. The specific input/output connections to and from this chip as provided in the I/0 drive line array 82 are specifically indicated as disposed near the edge of the chip 88 and have been annotated with their function to render their character apparent. The specific nature of the inputs and outputs provided on the driver chip 80 may be varied to suit the choice of designer.

The location of the initial and end output pads on each of the remaining three sides 90, 92 and 94 of the driver chip 80 are also indicated while the boundary lines 18 and 20 illustrated in FIG. 1 have also been indicated by way of the dashed line annotated 18 or 20 in FIG. 2. Although only 4 exemplary conductors have been shown in FIG. 2, the interrelationships in the patterning among the conductors in each 64 conductor group may be appreciated upon an inspection of FIG. 4 which shows an exemplary grouping of conductors.

An inspection of FIG. 2 will readily reveal that each of the 64 conductors to be connected to a specific driver chip 80 is brought out from the display area having the same width as was employed in the display area. In this case this width corresponds to approximately 0.0033 inches, although spacing may vary from 112 to 115 um. Thus, until the location indicated by the boundary line 18 or 20 the width of each conductor may be retained at that employed in the display area.

After the boundary area indicated by the dashed line 18 or 20, the width of each of the 64 row or column conductors within a specific group is thinned by approximately one half to a typical thickness of 0.0015 inch to facilitate the patterning illustrated in FIGS. 2 and 4 and brought to a location 96-99 where it is directly opposite to the pad 1, 25, 41, 64 on the row or column driver 80 to which connection is to be affected. At this location, the conductor is again thickened in the manner indicated in FIGS. 2 and 4 so as to have a width which corresponds to the approximate 4 mil width of each of the pads 1, 25, 41 and 64 of the row or column driver chip 80. The patterning of each of the 64 conductors to be connected to an individual row or driver chip 80 may be achieved through conventional photomask techniques. As indicated in FIG. 2, each of the 64 row or driver conductors once patterned is brought to a location indicated by the dashed edges 90, 92 and 94 of the row or driver chip 80 which essentially corresponds to where the edge will reside once the row or column driver 80 is mounted in the array being formed.

The distance between the edge of the driver chip 92 and the boundary line 18 or 20 may typically be 0.128 inch. The distance from the edges 90 and 94 of the driver chip 80 to the outer edges of the connectors 100 and 102, the conductors connected to outputs 1 and 64 of the driver chip 80, may typically be 0.08675 inch. Thus, it will be seen that the 64 row or column conductors grouped for connection to a particular row or column driver chip 80 are patterned in the manner illustrated in FIG. 2 and further shown in FIG. 4 so as to provide a location for the row or column driver chip 80 per se as indicated by the dashed lines 88, 90, 92 and 94 in FIG. 2 and to bring each of the conductors to a location opposite to its connection pad at a width corresponding to the pad width of the output on the row or column driver 80 to which it is to be connected. Further, the thinning of the conductor width between the location indicated by the boundary line 18 or 20 and its location opposite to the pad to which it is to be connected readily facilitates the patterning being conducted. This can readily be achieved through the use of the same photomask techniques noted above.

Once the entire conductor structure for the monolithic flat panel display apparatus illustrated in FIG. 1 is formed in the manner described, the actual row and column drivers $10_1$-$10_n$ and $12_1$-$12_n$ are mounted on the panel formed. More particularly, through the use of a conventional chip mounting machine, each of the row and column driver chips $10_1$-$10_n$ and $12_1$-$12_n$ have a small spot of optical cement or the like as available from Norland Corp. or similar material placed on the bottom thereof and the same is positioned, again through the use of a chip mounting machine or the like, within the outline provided as indicated by the dashed lines 88, 90, 92 and 94 in FIG. 2. The optical cement utilized is curable upon exposure to ultraviolet radiation. Once all of the row and column driver chips $10_1$-$10_n$ and $12_1$-$12_n$ are properly positioned in the location indicated by the dashed lines 88, 90, 92 and 94 in FIG. 2 on the array, the entire panel is treated in the manner indicated in FIG. 3 to optically cause the driver chips $10_1$-$10_n$ and $12_1$-$12_n$ to bond to the display panel by the curing of the optical cement disposed as a small spot intermediate the bottom surface of the row or column driver chip 80 and the display panel.

Figure 3:
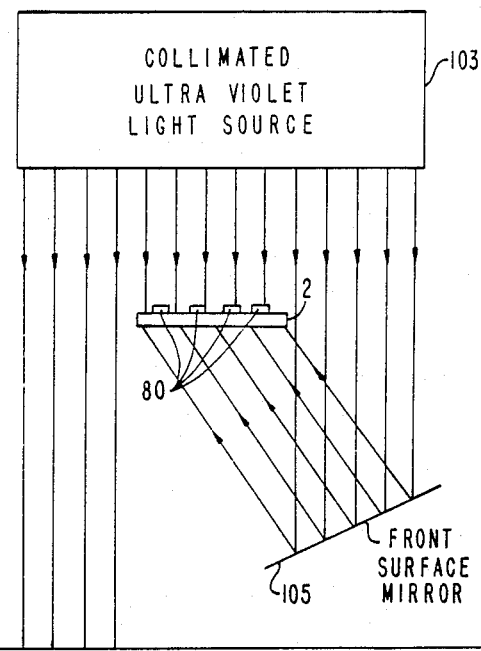
FIG. 3 illustrates an exemplary embodiment of the driver circuit chip mounting techniques according to the instant invention.

Referring now to FIG. 3 there is shown an optical bonding technique according to the instant invention for bonding chips 80 to the surface of a display panel at least to an extent enabling the display panel to be inverted and directly exposed to ultraviolet radiation to complete curing of the bonding material. More particularly, as shown in FIG. 3, the electrophoretic display panel 2 being formed and having the driver chips 80 positioned thereon in the manner described in connection with FIG. 2 is disposed beneath a source 103 of collimated ultraviolet radiation. A front surface mirror 105 is positioned with with respect to the source 103 and the electrophoretic display panel 2 to enable collimated ultraviolet radiation from source 103 to be imaged through the glass panel 2 to the back of the driver chips 80. This acts to activate the spots of optical cement disposed thereon when the same were mounted by the chip mounting machine in the manner described in connection with FIG. 2. The collimated ultraviolet light source 103 may take any of the conventional forms of this well known class of device. It should be noted that since the source 103 is typically produced for purposes of imaging radiation through a photomask, such as employed in the manufacture of integrated circuits, it is generally not configured for imposing radiation directly through the bottom surface of the electrophoretic display 2 being formed unless the same is inverted.

While collimated ultraviolet light sources are generally available, any ultraviolet source fitted with an appropriate collimating lens may be employed. Those of ordinary skill in the art will appreciate that collimated light is preferred since the same will undergo less scattering when being projected through the glass on which the electrophoretic display 2 is formed. More particularly, anytime radiation is imaged through a glass substrate, such as substrate 2, losses due to both absorption and scattering will occur. While losses due to absorption must be tolerated, losses associated with scattering or the like may be reduced by using collimated radiation. Hence, scattering may be markedly reduced when all of the radiation imaged through the glass substrate 2 is parallel or within the same solid angle.

The light from the collimated ultraviolet source 103 is imaged, as indicated in FIG. 3, onto a front surface mirror 105 where the same is reflected through electrophoretic panel 2 and hence to the back of the chips 80 thereon to actuate the spots of optical cement thereon which begin to cure. A front surface mirror 105 is selected to again reduce losses associated with absorption and scattering. Thus, those of ordinary skill in the art will appreciate that with a front surface mirror refraction will occur at the surface. Therefore, light loss due to absorption which may take place as ultraviolet entry traverses through the glass of a rear surface mirror is avoided. Similarly the scattering losses associated with refraction at each surface of the glass of a rear surface mirror is also avoided. Hence, use of a front surface mirror markedly reduces the light losses involved.

The light reflected from the front surface mirror 105 is directed through the glass substrate 2 of the electrophoretic display panel 2 being formed onto the back of the chips 80 which were positioned, as aforesaid, by a chip mounting machine and have a spot of optical cement thereon. In traversing through the glass substrate 2 losses associated with the absorption characteristic of the substrate will occur, however, scattering may be minimized through the use of collimated ultraviolet light as aforesaid, and imposing the light at a relatively large angle preferably between 45° and 90° so that a low angle of incidence is obtained.

Through actual tests conducted, it has been ascertained that exposure of the rear of the driver chips 80 through the glass substrate for approximately five minutes will render the optical cement sufficiently tacky to permit the panel to be inverted without any displacement of the driver circuits 80 mounted thereon.

Accordingly, after approximately five minutes of exposure, the electrophoretic panel 2 may be inverted so that exposure directly from the collimated ultraviolet source 103 through the bottom of the electrophoretic panel 2 may take place without further need for the front surface mirror 105. After a period of less than five minutes of direct exposure, the optical cement acts as if the same is completely cured.

Once curing of the optical cement 80 has occurred, wire bonding of the input and output pads on each of the driver circuits 80 to their respective input and output conductors, which are metalized, is completed in a manner to be briefly described in connection with FIG. 4. Thereafter, as will be readily appreciated by those of ordinary skill in the art, an anode is then placed over at least the display area, a suspension of electrophoretic material is inserted into the electrophoretic panel and the panel is sealed. This occurs in precisely the manner described in U.S. Pat. No. 4,655,897 as aforesaid.

The bonding technique set forth in connection with FIG. 3 is viewed as highly advantageous for several reasons. The first is that it provides a substantial time saving over the technique described in U.S. Pat. No. 4,772,820 wherein low temperature thermal setting epoxy or the like is placed on the bottom of each driver chip and thereafter the entire panel is baked at a temperature of approximately 120° C. for approximately two hours to allow the epoxy bond formed intermediate the bottom surface of the row or column driver chips 80 and the display panel to cure. Thus, in this respect, a saving of approximately one hour and fifty minutes results between when the driver circuits 80 are positioned by the chip mounting machine and the row and column chips are bonded to the panel allowing wire bonding of the row and column driver circuits to their respective input/output conductors and subsequent completion of the panel.

However, what is even more important is that the instant bonding technique allows selected row or column driver circuits to be replaced once the electrophoretic display panel is completed and defective driver circuits are ascertained upon a testing thereof. Thus, those of ordinary skill in the art will appreciate that once the completed panel is formed the same is tested to insure proper operability. During such test it may be ascertained that one or more row or column driver circuits are defective from the standpoint of not properly energizing one or more of the 64 outputs thereof. When this occurs, the panel is faulty.

Since in a typical 8½ by 11 display some 35 column and 27 row driver circuits are involved, it will be readily appreciated that substantial expense would be incurred in discarding such a panel when one or more defective row or column driver circuits are ascertained. However, while a given driver circuit may be readily removed and a new driver circuit positioned on a completed panel, bonding employing the baking technique described in U.S. Pat. No. 4,772,820 becomes a substantial problem since baking of the completed electrophoretic panel at a temperature of 120° C. for two hours or the like will effectively destroy the panel. This occurs since the liquid electrophoretic material now present in the panel may be destroyed and the solvents therein may respond to the heat by causing the panel to either leak or in many instances actually fracture.

This should be distinguished from the bonding technique illustrated in FIG. 3 wherein all that is necessary for the replacement of a defective column driver circuit is that the defective row or driver circuit be removed by breaking the optical cement bond and replaced by another driver circuit with a spot of optical cement disposed on the rear portion thereof. Once the same is properly positioned, the chip involved would be exposed to collimated ultraviolet radiation from source 103 which is imaged through the glass substrate 2 of the now fully assembled electrophoretic panel through the use of the front surface mirror 105. After approximately five minutes the optical cement will be sufficiently tacky to enable the panel to be inverted and again exposed directly to the collimated ultraviolet source 103 through the glass substrate 2. In less than five minutes the optical cement will appear completely cured. Thus, in this manner, defective row or column driver circuits may be replaced without requiring any heat and the detrimental effects of such heat on the pigment suspension and/or the panel per se are wholly avoided. It should be noted that this chip replacement technique is also applicable for the repair of a panel at anytime during its lifetime.

Once all of the row and column driver circuits 80 have been bonded to the electrophoretic panel being formed, actual connection of each of the 64 row or column conductors for each row or driver circuit is made to each of the 64 outputs of the row or column driver chip 80 and each of the 10 inputs/outputs at the rear of the chip along edge 88 is connected to associated ones of the conductors within the I/0 drive line array 82. This is accomplished, as briefly described in connection with FIG. 4.

Thus, referring now to FIG. 4 there is shown a top view, partially illustrating the manner in which a driver circuit 80 is connected to end portions of the row or column conductors within a group of 64 conductors in the monolithic flat panel display apparatus described herein. As shown in FIG. 4, the row or column driver circuit 80, once bonded to the glass panel or base plate 2, must have each of the contact pads 106 and 108 on the top surface thereof connected to associated ones of the row or column conductors 110 or 112, in the manner indicated in FIG. 4. To implement this function, the entire monolithic panel formed is placed in a wire bonding machine so that each of the pads 106 and 108 may be connected to corresponding conductors 110 and 112. The wire bonding machine is loaded with gold or aluminum wire and the wire bonding machine is set up for an appropriate ultrasonic bonding cycle. Thereafter, connection is typically initiated at the pad 106 or 108 on the driver chip, the preferred loop in the wire 114 is set and bonding to a conductor 110 occurs.

This process is continued by the operator from one contact pad 106 or 108 to the next until each of the 74 contact pads on the driver circuit 80 is connected wherein outputs 1-64 are connected to the 64 grouped row or column conductors associated with the display area while the 10 inputs to the driver circuit are connected to respective ones of the conductors within the I/0 drive line array 82. If a manual wire bonding machine is employed, this operation will take 10 to 15 minutes per driver chip 80. However, if an automatic wire bonding machine is utilized, once setup has been established, bonding of the 74 contact pads to appropriate conductors will occur at a rate of approximately one chip each 37 seconds. The scrubbing cycle for the vibrator is typically set to approximately 40 milliseconds in the bonding operation being carried out.

Since the pad and matching conductor widths are approximately 4 mils, the connection operation is well within the precision of most conventional wire bonding machines with connection within 1 mil of center being sufficiently accurate for purposes of the present device. Once an entire driver chip has been interconnected to its inputs and outputs, a protective cover 116 is placed over the driver circuit 80 to protect the circuit per se and each of the wire bonds made to the pads thereof. The cover 116 may be formed of ceramic or epoxy material.

After each of the row and column driver circuits have been connected to their respective inputs and outputs in the manner described above, the electrophoretic display panel is ready for final assembly. To this end, an anode typically formed of glass overcoated with a thin ITO layer is attached at least over the display area, an electrophoretic suspension is introduced into the panel and in the display area, in the manner described in U.S. Pat. No. 4,655,897, and thereafter the panel is sealed so that no leakage of the electrophoretic suspension may occur. The electrophoretic panel thus formed is tested, any necessary row or column driver circuits may then be replaced, and thereafter the same is mounted in an appropriate housing.

Although the instant invention has been described in connection with a highly specific exemplary embodiment thereof, it will be understood that many modifications and variations will occur to those of ordinary skill in the art. Therefore, it is manifestly intended that this invention be only limited by the claims and the equivalents thereof.

What is claimed is:

1. A method of bonding integrated circuits in a monolithic flat panel display comprising the steps of:
    placing a spot of optical cement which is curable upon exposure to ultraviolet radiation on a surface of an integrated circuit to be bonded;
    positioning said integrated circuit to be bonded on a first surface of a transparent display panel at a location adjacent to inputs and outputs of said display panel to be connected to said integrated circuit, said first surface and said surface forming an interface therebetween and said first surface of said display panel being disposed to support said integrated circuit; and
    exposing said interface to collimated ultraviolet radiation through a second surface of said transparent display panel, which second surface is disposed on the opposite side of said display panel from said first surface, until said spot of optical cement becomes sufficiently tacky so as to hold said integrated circuit if said display panel were inverted, wherein said step of exposing includes placement of said first surface beneath a source of collimated ultraviolet radiation and includes employing a front surface mirror to direct collimated ultraviolet radiation from the source at an angle other than 90° through said second surface to said interface.

2. The method according to claim 1 additionally comprising the steps of:
    inverting said display panel once said spot of optical cement has become sufficiently tacky so as to hold said integrated circuit if said display panel were inverted; and
    exposing said inverted display panel to collimated ultraviolet radiation through said second surface without directing said collimated ultraviolet radiation with said front surface mirror until said spot of optical cement cures.

3. The method according to claim 1, wherein said front surface mirror is disposed at a location to direct collimated ultraviolet radiation toward said second surface of said display panel at a low angle of incidence to reduce scattering, said low angle of incidence being the complement of angles between 45° and 90°.

4. A method of bonding integrated circuits in a monolithic flat panel display comprising the steps of:
    placing a spot of optical cement which is curable upon exposure to ultraviolet radiation on a surface of an integrated circuit to be bonded;
    positioning said integrated circuit to be bonded on a first surface of a transparent display panel at a location adjacent to inputs and outputs of said display panel to be connected to said integrated circuit, said first surface and said surface forming an interface therebetween and said first surface of said display panel being disposed to support said integrated circuit; and
    exposing said interface to ultraviolet radiation through a second surface of said transparent display panel, which second surface is disposed on the opposite side of said display panel from said first surface, until said optical cement becomes sufficiently tacky so as to hold said integrated circuit if said display panel were inverted, wherein said step of exposing includes placement of said first surface beneath a source of ultraviolet radiation and includes employing a front surface mirror to direct ultraviolet radiation from the source through said second surface to said interface.

5. The method according to claim 7 additionally comprising the steps of:
    inverting said display panel once said spot of optical cement has become sufficiently tacky so as to hold said integrated circuit if said display panel were inverted; and
    exposing said inverted display panel to collimated ultraviolet radiation through said second surface without directing said collimated ultraviolet radiation with said front surface mirror until said spot of optical cement cures.

* * * * *

UNITED STATES PATENT AND TRADEMARK OFFICE
CERTIFICATE OF CORRECTION

PATENT NO. : 4,892,607

DATED : January 9, 1990

INVENTOR(S) : Frank J. DiSanto and Denis A. Krusos

It is certified that error appears in the above-identified patent and that said Letters Patent is hereby corrected as shown below:

Claim 5, Column 14, line 56, after "claim" delete 7 and insert --4--.

Signed and Sealed this

Fifth Day of February, 1991

Attest:

HARRY F. MANBECK, JR.

Attesting Officer

Commissioner of Patents and Trademarks